United States Patent [19]
Chaki et al.

[11] Patent Number: 5,990,747
[45] Date of Patent: Nov. 23, 1999

[54] HIGH FREQUENCY AMPLIFIER CIRCUIT AND MICROWAVE INTEGRATED CIRCUIT

[75] Inventors: Shin Chaki; Yasuharu Nakajima, both of Tokyo, Japan

[73] Assignee: Mitsubishi Denki Kabushiki Kaisha, Tokyo, Japan

[21] Appl. No.: 09/026,721

[22] Filed: Feb. 20, 1998

[30] Foreign Application Priority Data

Sep. 12, 1997 [JP] Japan .................................. 9-248327

[51] Int. Cl.$^6$ .............................. H03F 3/60; H03F 3/14; H03F 7/38
[52] U.S. Cl. ............................ 330/286; 330/307; 333/32
[58] Field of Search .................................. 330/286, 277, 330/306, 307, 302; 333/32, 33

[56] References Cited

U.S. PATENT DOCUMENTS

| | | | |
|---|---|---|---|
| 4,525,678 | 6/1985 | Lehmann et al. | 330/277 |
| 4,658,220 | 4/1987 | Heston et al. | 330/277 |
| 4,885,541 | 12/1989 | Hayes | 333/32 |
| 5,818,880 | 10/1998 | Kriz et al. | 375/306 |

OTHER PUBLICATIONS

T.H. Chen, et al., "One Watt Q–Band Class A Pseudomorphic HEMT MMIC Amplifier." *IEEE MTT–S Digest* 1994 (pp. 805–808).

*Primary Examiner*—Robert Pascal
*Assistant Examiner*—Patricia T. Nguyen
*Attorney, Agent, or Firm*—Leydig, Voit & Mayer, Ltd.

[57] ABSTRACT

The present invention provides a high frequency amplifier circuit and a microwave integrated circuit which allow easy development of various models having different operating frequencies and other properties and improve the yield of production.

The high frequency amplifier circuit of the present invention comprises a high frequency transistor and a matching circuit connected between a terminal of the transistor and an external connection terminal, wherein the matching circuit has a variable capacitive element of which one end is connected to a terminal of the transistor and the other end is connected to the external connection terminal, and a short stub of which one end is connected to the other end of the variable capacitive element and the other end is directly grounded.

16 Claims, 9 Drawing Sheets

HIGH FREQUENCY AMPLIFIER CIRCUIT AND MICROWAVE INTEGRATED CIRCUIT

BACKGROUND OF THE INVENTION

1. Field of the Invention

The present invention relates to a high frequency amplifier circuit. More particularly, it relates to a high frequency amplifier circuit and a microwave integrated circuit used in microwave, sub-millimeter wave and millimeter wave bands.

2. Description of the Related Art

With the development of radio communications technologies, higher radio frequencies have come to be used and recently millimeter waves and sub-millimeter waves having frequencies beyond 20 GHz have been in use.

In amplifiers and MMIC (monolithic microwave integrated circuit) used at extremely high frequencies beyond 20 GHz, dispersion in the characteristics of active devices and dispersion in passive circuits greatly affect the circuit performance, thus making it difficult to achieve a high yield of production and presenting a hurdle against the effort of cost reduction. Also, in the stage of design or development, it is difficult to exactly determine the characteristics of active devices (equivalent circuit parameters) and the model parameters of passive circuits, and therefore target specifications can hardly be satisfied in a single trial fabrication. This situation has also resulted in a significant increase in the development cost. Also, because it takes a long period of time to develop one type of product, it has been difficult to allow small-lot production of various products having different characteristics such as frequency, gain and output power.

SUMMARY OF THE INVENTION

Thus, an object of the present invention is to provide a high frequency amplifier circuit and a microwave integrated circuit which can be easily extended into various models having different operating frequencies and other parameters, and allow it to improve the yield of production.

In order to solve the problems of the prior art described above, the present inventors have found a matching circuit which can be easily applied to different frequencies and allows for variations in the characteristics or parameters of active devices, such as field effect transistors. Thus, the present invention has been accomplished.

That is, the present invention provides a high frequency amplifier circuit comprising a high frequency transistor and a matching circuit connected between a terminal of the transistor and an external connection terminal, wherein the matching circuit has a variable capacitive element of which one terminal is connected to the terminal of the transistor and the other terminal is connected to the external connection terminal, and a short stub which is connected to the other terminal of the variable capacitive element at one end and is directly grounded at the other end thereof.

The high frequency transistor herein refers to a transistor capable of operating at relatively high frequencies such as microwave, sub-millimeter waves and millimeter waves, including field effect transistor (FET), high electron mobility transistor (HEMT) and hetero-junction bipolar transistor (HBT).

In the high frequency amplifier circuit described above, the matching circuit is preferably connected to the transistor as an input matching circuit.

Also in the high frequency amplifier circuit of the present invention, a field effect transistor or a diode can be used for the variable capacitive element. When configured in this way, capacitance of the variable capacitive element can be electrically adjusted.

Further in the high frequency amplifier circuit of the present invention, a capacitive element may be provided in parallel with the variable capacitive element in the matching circuit. This configuration makes it possible to construct only the variable range from the variable capacitive element.

Also in the high frequency amplifier circuit of the present invention, a resistive element may be installed between the other terminal of the variable capacitive element and one end of the short stub in the matching circuit. Gain of the high frequency amplifier circuit can also be adjusted with this configuration.

The first microwave integrated circuit according to the present invention comprises a high frequency amplifier circuit having a high frequency transistor and a matching circuit connected to a terminal of the transistor, being formed on a semiconductor substrate; wherein the matching circuit includes an MIM capacitor having an insulation layer interposed between an upper electrode and a lower electrode with either the upper electrode or the lower electrode being connected to the first terminal of the transistor, and a short stub comprising a strip electrode of which one end is connected to the other electrode of the MIM capacitor and the other end directly grounded; and the upper electrode is formed by using a mask which has an aperture area corresponding to the capacitance required in the high frequency amplifier circuit for the operating frequency.

With this configuration, a matching circuit suited for the operating frequency can be formed by changing only the mask used when forming the upper electrode.

In the first microwave integrated circuit described above, the strip electrode may be formed in such a configuration that includes a C-shaped portion in a part thereof while the C-shaped portion is appropriately sized so as to set the strip electrode length to a length required for the operating frequency of the high frequency amplifier circuit. With this configuration, capacitance of the MIM capacitor and parameters of the short stub can be set to specified values, thus making it possible to make a matching circuit more suited for the operating frequency.

The second microwave integrated circuit according to the present invention comprises a high frequency amplifier circuit having a high frequency transistor and a matching circuit connected to a terminal of the transistor, being formed on a semiconductor substrate; wherein the matching circuit includes an MIM capacitor having a dielectric layer interposed between an upper electrode and a lower electrode with either the upper electrode or the lower electrode being connected to the first terminal of the transistor, and a short stub comprising a strip electrode of which one end is connected to the other electrode of the MIM capacitor and the other end is directly grounded; and the upper electrode comprises a plurality of separated electrodes while the capacitance of the MIM capacitor is set to a value required in the high frequency amplifier circuit for the operating frequency by using at least one of the plurality of separated electrodes.

In the second microwave integrated circuit described above, the strip electrode may be formed in such a configuration that includes a C-shaped portion in a part thereof while the C-shaped portion is sized so as to set the length of the strip electrode to a length required for the operating frequency of the high frequency amplifier circuit.

With this configuration, capacitance of the MIM capacitor and parameters of the short stub can be set to specified values, making it possible to make a matching circuit more suited for the operating frequency.

In the second microwave integrated circuit described above, connection between the separated electrodes and the first terminal, or between the strip electrodes or between the separated electrodes may be wired by means of air bridge.

With this configuration, a matching circuit suited for various operating frequencies can be made by connecting between specified electrodes by means of the air bridge without changing the pattern formed on the substrate.

DESCRIPTION OF THE PREFERRED EMBODIMENT

Now preferred embodiments of the present invention will be described below with reference to the accompanying drawings.

Embodiment 1

Figure 1:
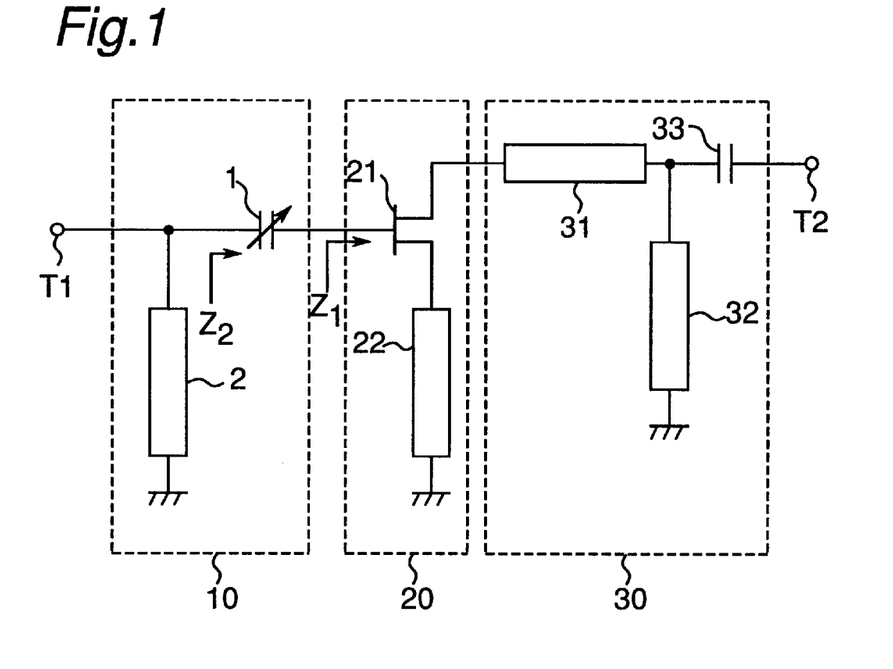
FIG. 1 is a circuit diagram of the high frequency amplifier circuit according to the first embodiment of the present invention.

FIG. 1 is a circuit diagram showing the circuit configuration of a high frequency amplifier circuit according to the first embodiment of the present invention. The high frequency amplifier circuit according to the first embodiment comprises, as shown in FIG. 1 for example, an active circuit 20 including a transistor 21 such as a field effect transistor, an input matching circuit 10 and an output matching circuit 30. In the high frequency amplifier circuit according to the first embodiment, the input matching circuit 10 has a variable capacitive element 1 including one terminal connected to a gate terminal of the transistor 21 and another terminal connected to one terminal of a short stub 2 Another terminal of the short stub 2 is directly grounded, and has advantages as described below. In FIG. 1, a bias circuit of the active circuit 20 is omitted.

The shorting end of a short stub used in microwave circuits and millimeter-wave circuits is generally connected to ground via a capacitive element. While a high frequency signal is shorted with this configuration, the circuit is open for direct current (DC) component and allows biasing of the active device such a transistor. In the input matching circuit 10 according to the present invention, on the other hand, because the variable capacitive element 1 is connected in series for the purpose of matching the input impedance, the circuit is open for direct current across the transistor 21 and the short stub 2, and therefore the other end of the short stub 2 can be directly grounded without using capacitance. Thus, a shorting effect can be achieved even for direct current components by directly grounding the other end of the short stub 2. Also because the short stub 2 is used for matching in the sub-millimeter-wave and millimeter-wave bands, electrical length thereof is negligible in a frequency region below several tens of megahertz, and therefore an effect equivalent to shorting can be achieved in a region below the MHz band, similar to the case of direct current. Thus the gain can be effectively suppressed in the low frequency region below the MHz band, thereby making stable circuit operation possible in amplifiers of microwave and millimeter-wave regions. In the case of the conventional stub grounded via the MIM capacitor, on the other hand, effect of the MIM capacitor becomes relatively significant in frequency region below the resonant frequency of the stub, and therefore it cannot be regarded as shorted in the MHz band as well as for direct current. The effect of using the short stub 2 described above can be obtained similarly by changing the dimension of the short stub 2 for matching at the operating frequency. Therefore, while length of the short stub has been adjusted to combine the effects of both the suppression of gain at low frequencies and the matching at high frequencies, the short stub 2 of which the other end is directly grounded is used in the first embodiment thereby making it possible to set the length of the short stub 2 by considering only the matching in the desired frequency region and improve the design efficiency, without considering the low frequencies during designing.

The procedure for setting parameters of the input matching circuit 10 according to the first embodiment of the present invention will now be described below.

In the circuit of FIG. 1, input impedance $Z_1$ of the transistor 21 is given by the following equation.

$$Z_1 = R_1 + jX_1 \qquad (1)$$

When the variable capacitive element 1 (capacitance C) is added to this circuit in series, input impedance $Z_2$ of the transistor 21 viewed via the variable capacitive element 1 is given by equation 2 and admittance $Y_2$ is given by equation 3.

$$Z_2 = R_1 + j(X_1 + Xc) \quad (2)$$

where $Xc = -j/(\omega C)$ $$Y_2 = R_1/(R_1^2 + (X_1+Xc)^2) - j(X_1+Xc)/(R_1^2+(X_1+Xc)^2) \quad (3)$$

Then capacitance C of the variable capacitive element 1 is set so that relationship $Re(Y_2)=1$ holds. That is, capacitance C is set to the value given by equation 4 based on the relationship of $R_1/(R_1^2 + (X_1+Xc)^2) = 1$.

$$C + \omega(X_1 + (R_1(1-R_1))^{0.5})^{-1} \quad (4)$$

Then admittance $Y_{T1}$ determined from impedance $Z_{T1}$ of the transistor 21, viewed from the input terminal T1 with the short stub 2 connected, is given by equation 5. L in equation 5 represents the inductance of the short stub 2.

$$Y_{T1} = 1 - j((X_1+Xc)/(R_1^2+(X_1+Xc)^2) + 1/(\omega L)) \quad (5)$$

Then inductance L is set so that $Im(Y_{T1})=0$ is satisfied. That is, inductance L is set to the value given by equation 6.

$$L = -(R_1^2 + (X_1+Xc)^2)/(\omega(X_1+Xc)) \quad (6)$$

Further, electrical length of the short stub 2 is set so that the inductance given by equation 6 is obtained. Through these procedures, capacitance C of the variable capacitive element 1 and electrical length of the short stub 2 in the input matching circuit 10 are set.

Figure 2:
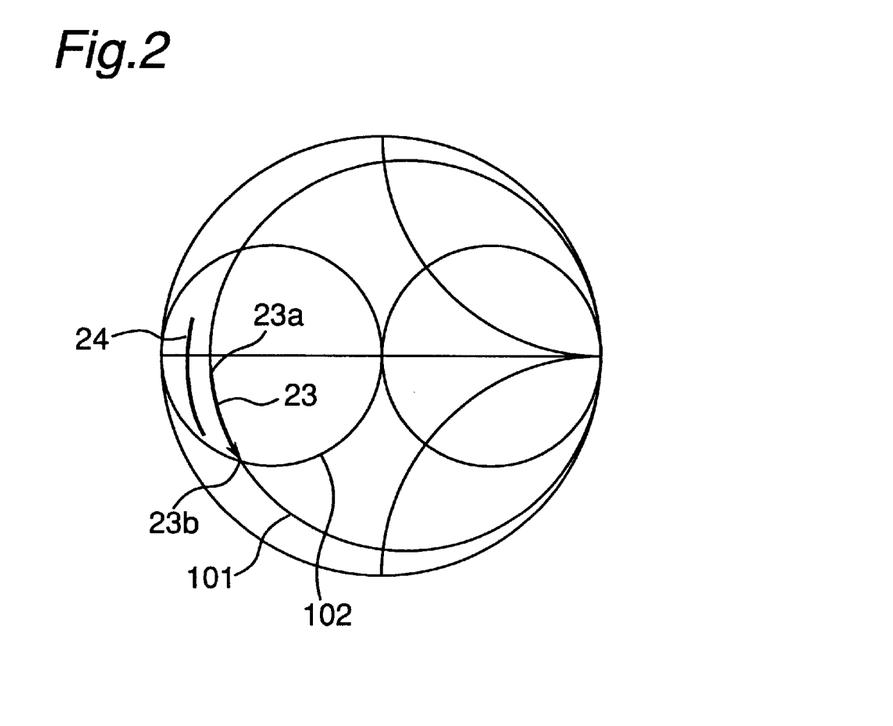
FIG. 2 is a Smith chart showing the frequency characteristic of input reflection coefficient S11 of the transistor of FIG. 1 and the change in impedance with the change in capacitance of the variable capacitive element 1.

The above procedures will be explained below with reference to Smith chart. The Smith chart of FIG. 2 shows the frequency characteristic 24 of input reflection coefficient S11 at the gate terminal of the transistor 21 and the change in input impedance $Z_1$ of the gate terminal of the transistor 21 when viewed through the variable capacitive element 1. In the Smith chart of FIG. 2, arrow 23 represents the direction of the change in the input impedance $Z_2$ when the capacitance of the variable capacitive element is gradually increased from 0, as the gate of the transistor 21 is viewed through the variable capacitive element 1. Start point 23a of the arrow 23 represents the input impedance $Z_1$ of the gate terminal of the transistor 21 as directly viewed. As shown in FIG. 2, the input impedance $Z_2$ changes on a constant resistance circle 101 corresponding to the capacitance of the variable capacitive element 1. Therefore parameters are set by first setting the capacitance of the variable capacitive element 1 so that the input impedance $Z_2$ of the gate terminal of the transistor 21 viewed through the variable capacitive element 1 lies at the intersection 23b of the constant resistance circle 101 and a constant conductance circle 102 on the Smith chart of FIG. 2. This operation corresponds to an operation of setting the capacitance C of the variable capacitive element 1 so that equation $Re(Y_2)=1$ holds. When the short stub 2 is connected across the other terminal of the variable capacitive element 1 and the grounding terminal as shown in the FIG. 1 of the matching circuit 10 under this condition, input impedance $Z_{T1}$ viewed from the input terminal T1 changes on the constant conductance circle 102 in correspondence to the length (electrical length) 4 of the short stub 2. The constant conductance circle 102 is a circle that passes the center of Smith chart. Thus in the next step, length (electrical length) of the short stub 2 is set so that the input impedance $Z_{T1}$ viewed from the input terminal T1 lies at the center in the Smith chart of FIG. 2. This operation corresponds to the operation of setting the inductance L to satisfy the relation $Im(Y_{T1})=0$, described previously.

By setting the capacitance of the variable capacitive element 1 and the length (electrical length) of the short stub 2 as described above, the gate terminal of the transistor 21 which is connected to the input matching circuit 10 is matched to 50 ohm (center of the Smith chart of FIG. 2) that is commonly used in microwave and millimeter-wave circuits.

Figure 3:
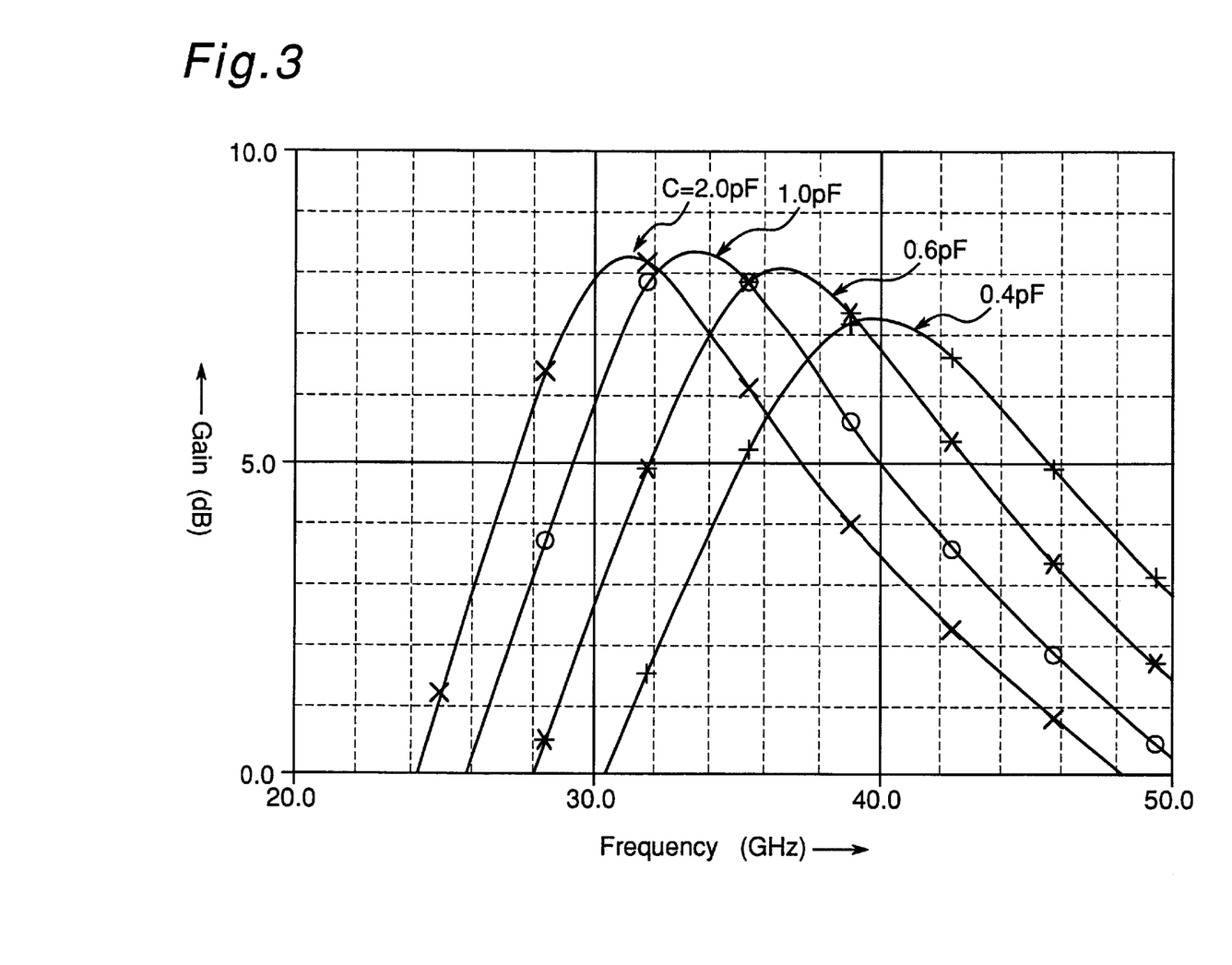
FIG. 3 is a graph showing the frequency characteristic of gain of the transistor of FIG. 1.

In the Smith chart of FIG. 2, an example of frequency characteristic with input reflection coefficient S11 of the transistor is indicated with line 24. This example employs HEMT as the transistor. As shown in FIG. 2, input impedance $Z_2$ which corresponds to the change in capacitance of the variable capacitive element 1 changes in the same sense as the frequency characteristic of the transistor 21 (arrow 23 and line 24 are almost parallel with each other) in the input matching circuit 10 of the first embodiment. This means that the frequency for which the impedance is to be matched can be changed simply by changing the capacitance of the variable capacitive element 1. FIG. 3 shows the frequency characteristic of the gain when the capacitance of the variable capacitive element 1 is changed. The frequency where the gain reaches the peak can be changed from 40 GHz to 31 GHz by simply changing the capacitance of the variable capacitive element 1 from 0.4 pF to 0.6 pF, 1.0 pF and 2.0 pF.

Figure 4:
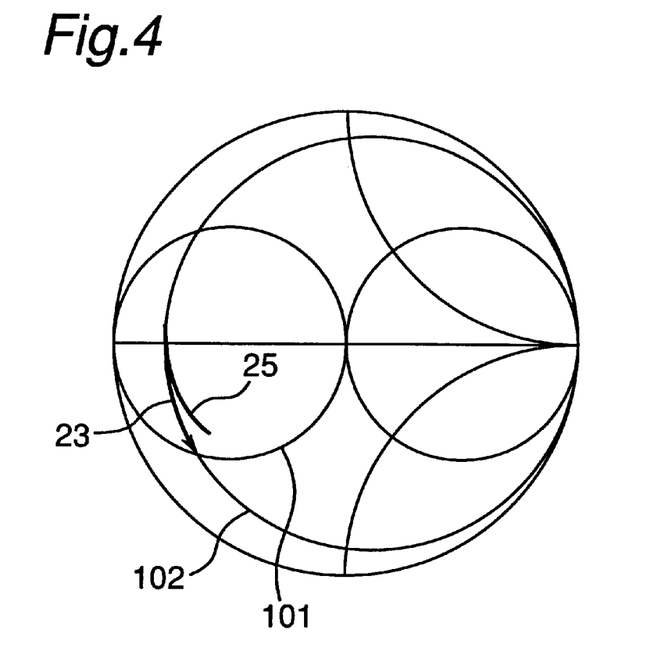
FIG. 4 is a Smith chart showing the gate width dependence of input reflection coefficient S11 of the transistor of FIG. 1.

In the Smith chart of FIG. 4, gate width dependency of the input reflection coefficient S11 at the gate terminal of the transistor 21 is indicated with line 25. As will be clear from FIG. 4, line 25 indicating the gate width dependency of the input reflection coefficient S11 is almost parallel with the arrow 23, similar to the case of frequency characteristic. This means that, in the input matching circuit 10, satisfactory matching can be achieved by changing the capacitance of the variable capacitive element 1 for the gate width dependency of the input reflection coefficient S11. Thus matching can be adjusted to obtain a certain level of quality, even when the gate width of the transistor 21 varies due to the variation in the manufacturing process. Also when transistors of different gate widths are used, it can be accommodated simply by changing the capacitance in the input matching circuit.

The high frequency amplifier circuit according to the first embodiment, which is constructed as described above, is provided with the input matching circuit 10 having the variable capacitive element 1 of which one terminal is connected to the gate terminal of the transistor 21 and the short stub 2 of which one end is connected to the other terminal of the variable capacitive element 1 and the other end is directly grounded, and therefore has excellent effects as described below.

(1) Input terminal impedance of the transistor can be matched to, for example, 50 Ohms in a specified frequency range for a given operating frequency, only by changing the capacitance of the variable capacitive element, without changing the remaining circuit configuration (including parameters). This makes it easy to develop a series of models operating at different frequencies for the high frequency amplifier circuit.

(2) For example, input terminal impedance of the transistor can be matched to, for example, 50 Ohms only by changing the capacitance of the variable capacitive element in correspondence to the gate width of the transistor 21 which determines the maximum output power, without changing the remaining circuit configuration (including parameters), thereby making it easy to develop a series of models having different output characteristics.

(3) Also the input terminal impedance of the transistor can be matched to, for example, 50 Ohms only by adjusting the capacitance of the variable capacitive element even when the input terminal impedance of the transistor varies due to the variation in the gate electrode width, thereby improving the yield of production.

Figure 5:
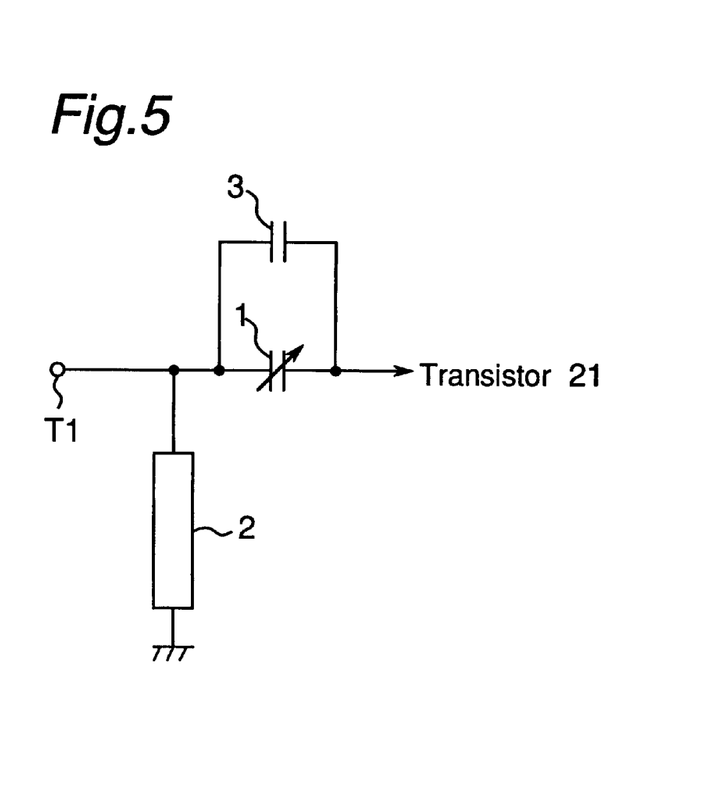
FIG. 5 is a circuit diagram of the input matching circuit of a variation of the first embodiment of the present invention.

In the first embodiment described above, a fixed capacitive element 3 may also be installed in parallel with the variable capacitive element 1, as shown in FIG. 5. This configuration makes it possible to constitute only the portion of capacitance which requires adjustment with a variable capacitive element. Assuming that the range of adjustment of the variable capacitive element 1 is from C10 to C1, the adjustable range can be changed to a range from C10+C3 to C11+C3 by adding the capacitive element 3 having a capacitance C3.

Embodiment 2

Figure 6:
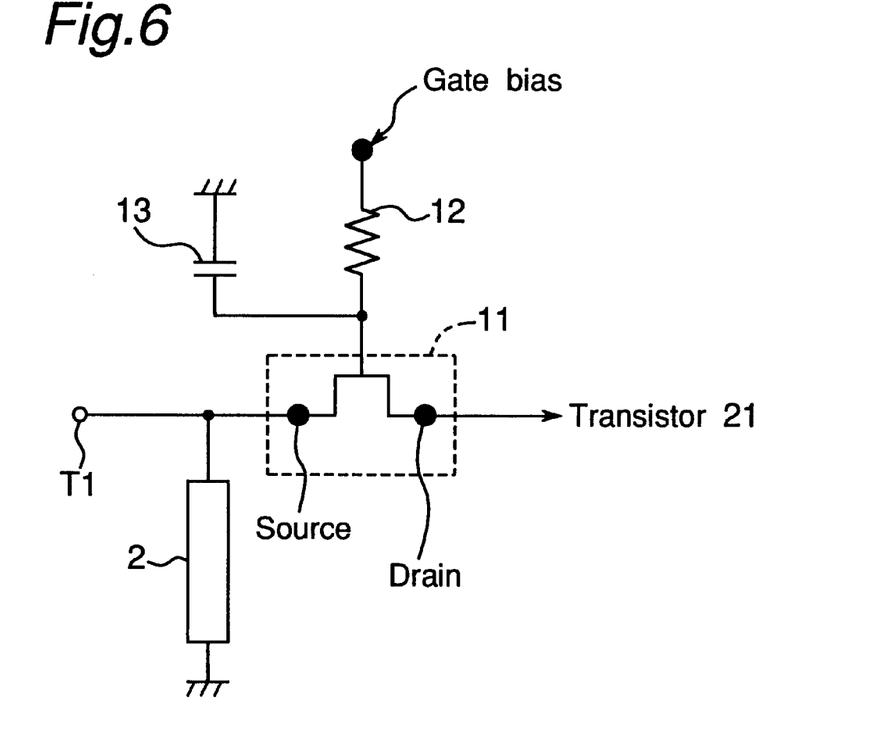
FIG. 6 is a circuit diagram of the input matching circuit of the high frequency amplifier circuit according to the second embodiment of the present invention.

FIG. 6 shows an input matching circuit of the high frequency amplifier circuit according to the second embodiment of the present invention, where the input matching circuit is made by employing a field effect transistor 11 as the variable capacitive element. The high frequency amplifier circuit according to the second embodiment is made similarly to the first embodiment, except that an input matching circuit shown in FIG. 6 is used instead of the input matching circuit 10 of the high frequency amplifier circuit of the first embodiment shown in FIG. 1. In the input matching circuit shown in FIG. 6, a drain terminal of the field effect transistor 11 is connected to the gate of the transistor 21 of the active circuit 20 and a source terminal is connected to the input terminal T1, while the source terminal is grounded via the short stub 2. Gate bias voltage is applied via a resistor 12 to the gate of a field effect transistor 11. The junction of the resistor 12 and the gate of the field effect transistor 11 is grounded via a capacitor 13, thereby to remove high frequency components included in the bias voltage which is applied to the gate. In the input matching circuit shown in FIG. 6 which is constituted as described above, a bias voltage near pinch-off bias is applied to the gate terminal of the field effect transistor 11, and capacitance between the source and the drain of the field effect transistor 11 is controlled by changing the applied voltage. This provides a practical adjustment range from 0.01 pF to 0.2 pF. A capacitance beyond 0.2 pF can also be achieved by increasing the size of the field effect transistor. A diode may also be used instead of the field effect transistor 11 according to the present invention.

In the input matching circuit shown in FIG. 6 constituted as described above, value of capacitance can be changed electrically because the field effect transistor is used as the variable capacitive element.

In the second embodiment, the drain terminal of the field effect transistor 11 is connected to the gate of the transistor 21 and the source terminal is connected to the input terminal T1, while the source terminal is grounded via the short stub 2. However, the present invention is not limited to this configuration, and the source terminal of the field effect transistor 11 may be connected to the gate of the transistor 21 and the drain terminal may be connected to the input terminal T1, while grounding the drain terminal via the short stub 2. A circuit of such a configuration also operates similarly to the second embodiment and has similar effects.

Embodiment 3

Figure 7:
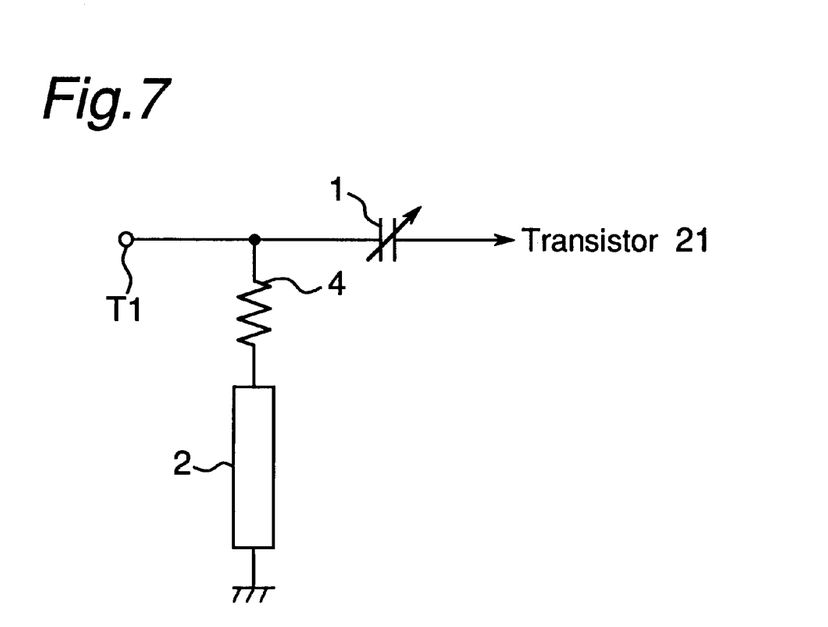
FIG. 7 is a circuit diagram of the input matching circuit of the high frequency amplifier circuit according to the third embodiment of the present invention.
Figure 8:
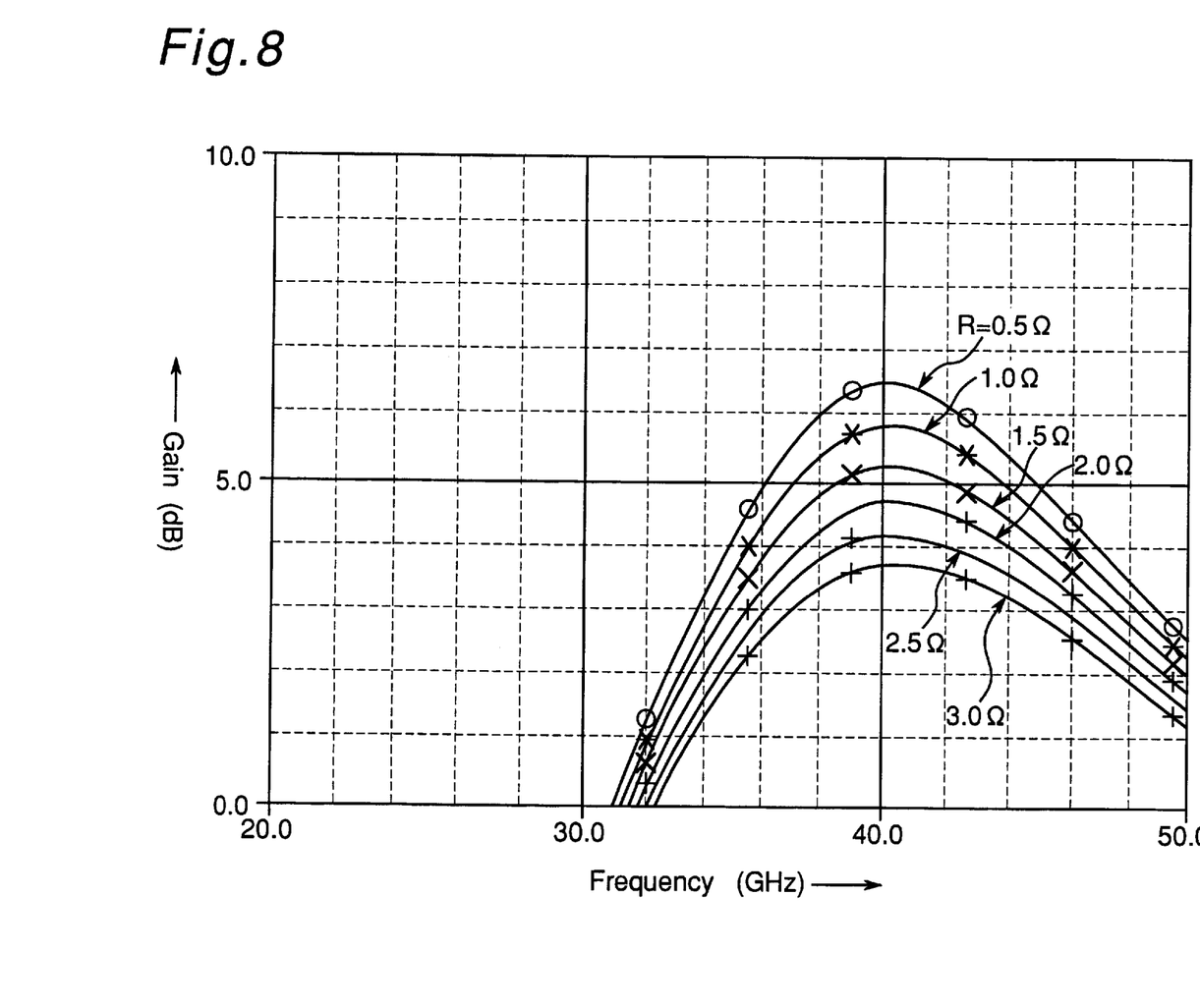
FIG. 8 is a graph showing the frequency characteristic of gain of the high frequency amplifier circuit of FIG. 7.

FIG. 7 shows an input matching circuit of the high frequency amplifier circuit according to the third embodiment of the present invention. In the high frequency amplifier circuit of the third embodiment, a resistor 4 is added in series with the short stub 2 in the input matching circuit thereby to set the gain at a specified frequency to a specified value. The high frequency amplifier circuit of the third embodiment has a gain shown in FIG. 8 and is capable of changing the gain by changing the resistance of the resistor 4 which is installed in series with the short stub 2. In the example shown in FIG. 8, it is shown that gain can be changed by about 2.5 dB by changing the resistance from 0.5 to 3.0 Ohms. Thus, the high frequency amplifier circuit of the third embodiment allows adjustment of the amplifier gain by selecting a proper resistor. Also in the third embodiment, the resistor 4 may be a variable resistor which enables a gain-adjustable or variable gain amplifier.

Embodiment 4

Figure 9:
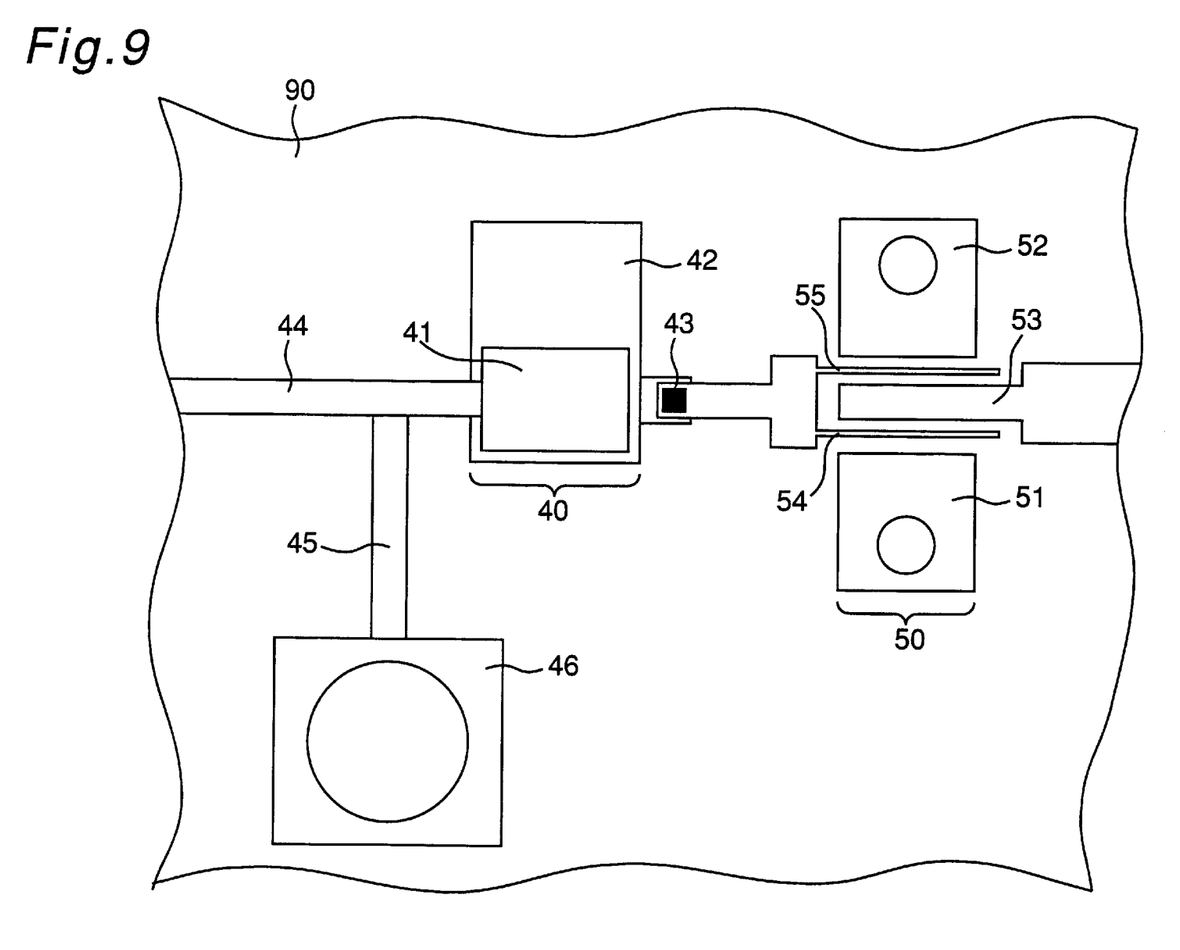
FIG. 9 is a plan view of the microwave integrated circuit according to the fourth embodiment of the present invention.

The fourth embodiment of the present invention is a microwave integrated circuit where the high frequency amplifier circuit shown in FIG. 1 is constituted by using a semiconductor substrate 90 made of GaAs, for example, with such a configuration as shown in FIG. 9. In the microwave integrated circuit, a transistor 50 which corresponds to the transistor 21 of FIG. 1 comprises source electrodes 51 and 52, a drain electrode 53 and gate electrodes 54 and 55, which are formed on the semiconductor substrate 90. An MIM capacitor 40 which corresponds to the variable capacitive element 1 of FIG. 1 is constituted from a lower electrode 42, a dielectric layer (not shown in the drawing) formed on the lower electrode 42 and an upper electrode 41 formed on the dielectric layer. A short stub comprises a strip electrode 45, while the tip (one end) of the strip conductor is connected to an electrode pad 46 and the electrode pad 46 is connected via a through hole to a ground terminal formed on an under surface of the semiconductor substrate 90.

Now connections between elements in the fourth embodiment will be described. In the fourth embodiment, a strip electrode 44 is, at one end thereof, connected to the upper electrode 41 of the MIM capacitor 40 and the other end of the strip electrode 45 is connected to a specified position of the strip electrode 44. The lower electrode 42 of the MIM capacitor 40 is connected to gate electrodes 54, 55 at the contact section 43. Source electrodes 51, 52 are connected via through holes to a ground terminal formed on the under side of the semiconductor substrate 90.

In the microwave integrated circuit of the fourth embodiment, in particular, capacitance of the MIM capacitor is controlled by making the lower electrode with a relatively large area and setting the area of the upper electrode according to the required value of capacitance, in order to obtain a value of capacitance required for different frequencies in the MIM capacitor.

With the microwave integrated circuit of the fourth embodiment constituted as described above, input matching circuits can be formed for different frequencies by changing only the mask used when forming the upper electrode in the wafer process, during which the electrodes and the other elements are formed on the semiconductor substrate 90. That is, according to the fourth embodiment, microwave integrated circuits for different frequencies can be made by changing only the mask when forming the upper electrode.

This makes it possible to reduce the period of time required for development in the development stage and, during manufacturing, to use common processes for different models except for the process of forming the upper electrode, thereby reducing the manufacturing cost.

In the fourth embodiment, similarly to the first embodiment, changes in the gate width of the transistor 50 (for example, changes in the gate width for different output characteristics) can be accommodated by changing the mask for the upper electrode, thereby making it possible to design the circuit layout in a shorter period of time for easy development of different models.

Further in the fourth embodiment, the strip electrode 45 is directly grounded by using the MIM capacitor 40. When grounding the strip electrode 45 via the MIM capacitor in general, capacitance of the MIM capacitor is set to be greater than the capacitance of the MIM capacitor 40 of the fourth embodiment. Therefore, in the microwave integrated circuit of the fourth embodiment, area of the pattern can be made smaller than the case where the strip electrode 45 is grounded via a capacitor.

Embodiment 5

Figure 10:
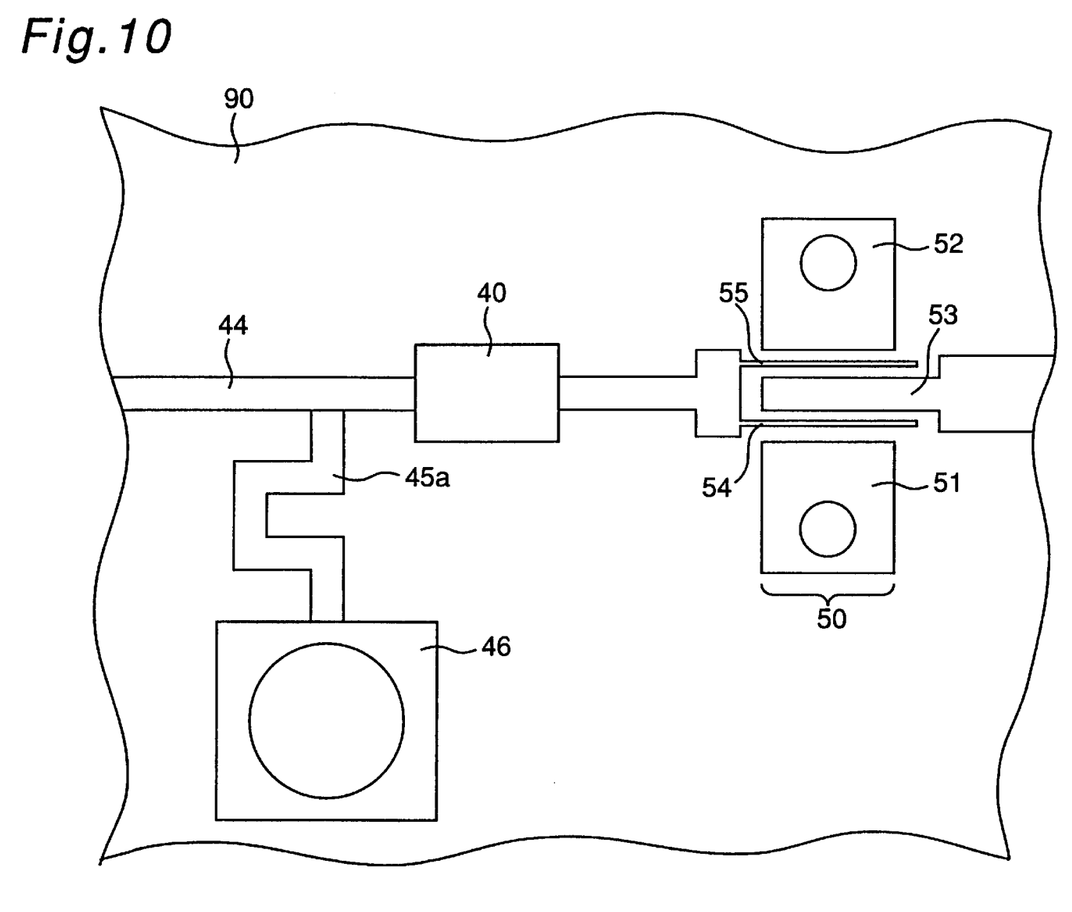
FIG. 10 is a plan view of the microwave integrated circuit according to the fifth embodiment of the present invention.

FIG. 10 is a plan view showing the pattern configuration of the microwave integrated circuit of the fifth embodiment. The microwave integrated circuit of the fifth embodiment is similar to the microwave integrated circuit of the fourth embodiment shown in FIG. 9, except that a strip conductor 45a which has a C-shaped portion is used instead of the strip conductor 45.

With the microwave integrated circuit of the fifth embodiment constituted as described above, entire length of the strip conductor 45a can be changed by changing the size (length) of the C-shaped portion of the strip conductor 45a. With this configuration, length of the strip conductor 45a (electrical length of the short stub) can be changed without changing the positional relationships between the other elements such as the strip electrode 44, the electrode pad 46 and the MIM capacitor 40.

That is, according to the fifth embodiment, the operating frequency can be set only by changing the mask used for forming the upper electrode of the MIM capacitor and the mask used for forming the strip electrode 45a, and different frequencies can be accommodated by changing the capacitance of the MIM capacitor and the electrical length of the short stub, and therefore the degree of freedom in the design is improved compared to the fourth embodiment.

Embodiment 6

A microwave integrated circuit of the sixth embodiment allows changing of the capacitance of the MIM capacitor without changing the masks used in the wafer process. In the sixth embodiment, two upper electrodes 63, 64 are formed on the lower electrode 65, with a dielectric layer placed inbetween, between the terminals 61, 62, thereby to constitute the MIM capacitor as shown in FIG. 11. The lower electrode 65 is connected to the contact section 66 while the upper electrodes 63, 64 and the lower electrode 65 are formed while being electrically separated from the terminal electrodes 61, 62. The lower electrode 65, the dielectric layer and the upper electrode 63 form the capacitance C1, while the lower electrode 65, the dielectric layer and the upper electrode 64 form the capacitance C2.

In the MIM capacitor formed as described above, different values of capacitance as described below are formed by using the electrodes in different combinations.

Figure 11A:
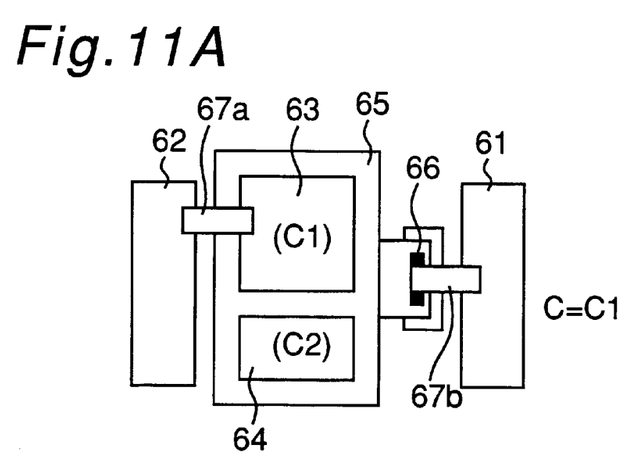
FIG. 11 is a plan view of the MIM capacitor in the microwave integrated circuit according to the sixth embodiment of the present invention, with different connecting configurations and the corresponding values of capacitance shown in A, B, C and D.

(1) As shown in FIG. 11A, capacitance of the MIM capacitor as a whole becomes C1, when the terminal electrode 61 and the contact section 66 are connected with the air bridge 67b, and the upper electrode 63 and the terminal electrode 62 are connected with the air bridge 67a.

Figure 11B:
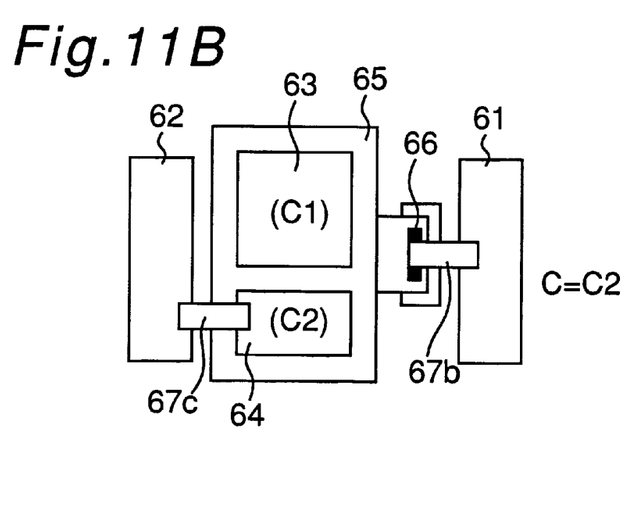

(2) As shown in FIG. 11B, capacitance of the MIM capacitor as a whole becomes C2, when the terminal electrode 61 and the contact section 66 are connected with the air bridge 67b, and the upper electrode 64 and the terminal electrode 62 are connected with the air bridge 67c.

Figure 11C:
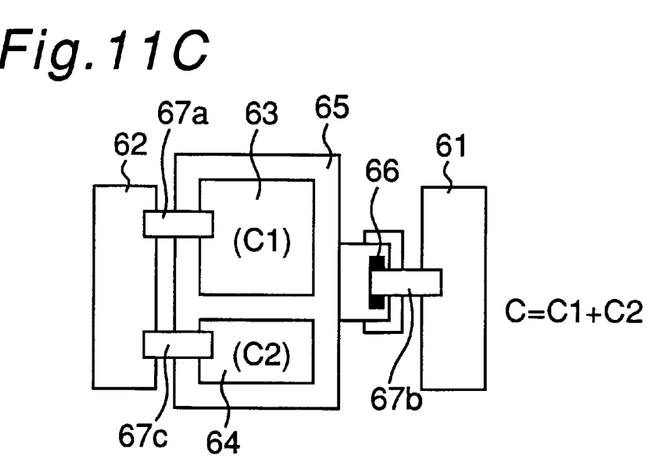

(3) As shown in FIG. 11C, capacitance of the MIM capacitor as a whole becomes C1+C2, when the terminal electrode 61 and the contact section 66 are connected with the air bridge 67b, the upper electrode 63 and the terminal electrode 62 a reconnected with the air bridge 67a and the upper electrode 64 and the terminal electrode 62 are connected with the air bridge 67c.

Figure 11D:
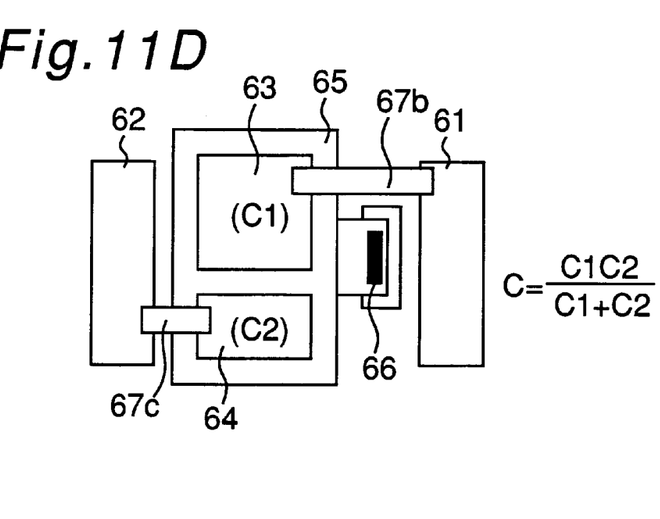

(4) As shown in FIG. 11D, capacitance of the MIM capacitor as a whole becomes (C1C2)/(C1+C2), when the terminal electrode 61 and the upper electrode 63 are connected with the air bridge 67d and the upper electrode 64 and the terminal electrode 62 are connected with the air bridge 67c.

According to the sixth embodiment, as described above, various values of capacitance can be formed by dividing the upper electrode into two upper electrodes 63 and 64 and connecting the elements in different combinations.

Also according to the sixth embodiment, because the wafer process is used in common and connections between electrodes are made by means of the air bridges in the assembly process after the electrodes have been formed, microwave integrated circuits which operate at various frequencies can be manufactured simply by making changes in the assembly process only.

Although the upper electrode is divided into two parts in the microwave integrated circuit of the sixth embodiment described above, the present invention is not limited to this configuration and the upper electrode may also be divided into three parts. By dividing into three parts, greater number of different capacitance values can be provided than the sixth embodiment.

Also according to the present invention, value of capacitance may be adjusted by separating the wiring between electrodes which are connected in the wafer process or the assembly process.

Variation of the Sixth Embodiment

Figure 12A:
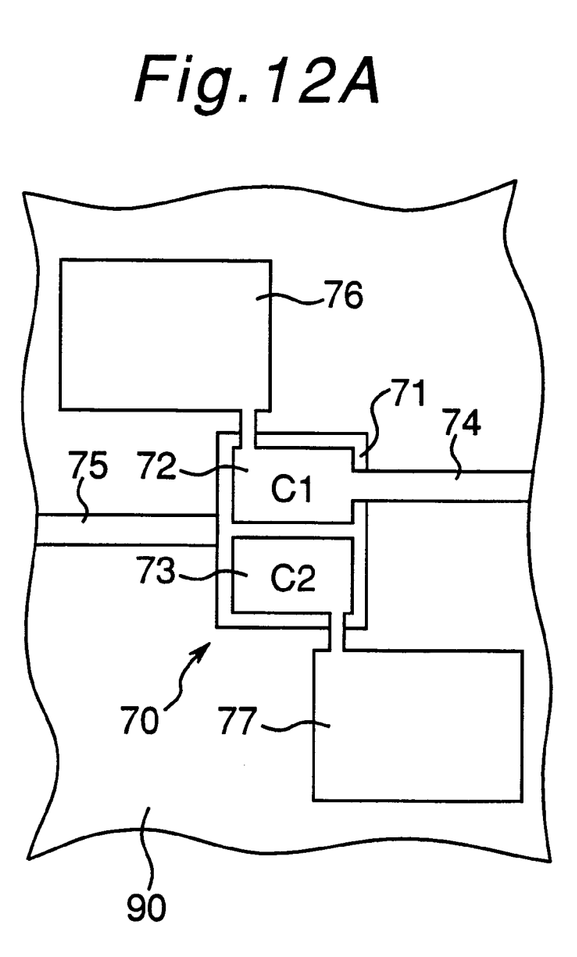
FIGS. 12A and 12B are plan views showing a pattern of the MIM capacitor in a variation of the microwave integrated circuit according to the sixth embodiment of the present invention.

FIG. 12A is a plan view showing the configuration of an MIM capacitor 70 in a microwave integrated circuit which is a variation of the sixth embodiment. The MIM capacitor 70 comprises a lower electrode 71, a dielectric layer formed on the lower electrode 71, and two upper electrodes 72, 73 formed on the dielectric layer. A strip conductor 75 is connected to the lower electrode 71, a strip conductor 74 and an electrode pad 76 are connected to the upper electrode 72, and an electrode pad 77 is connected to the upper electrode 73.

Figure 12B:
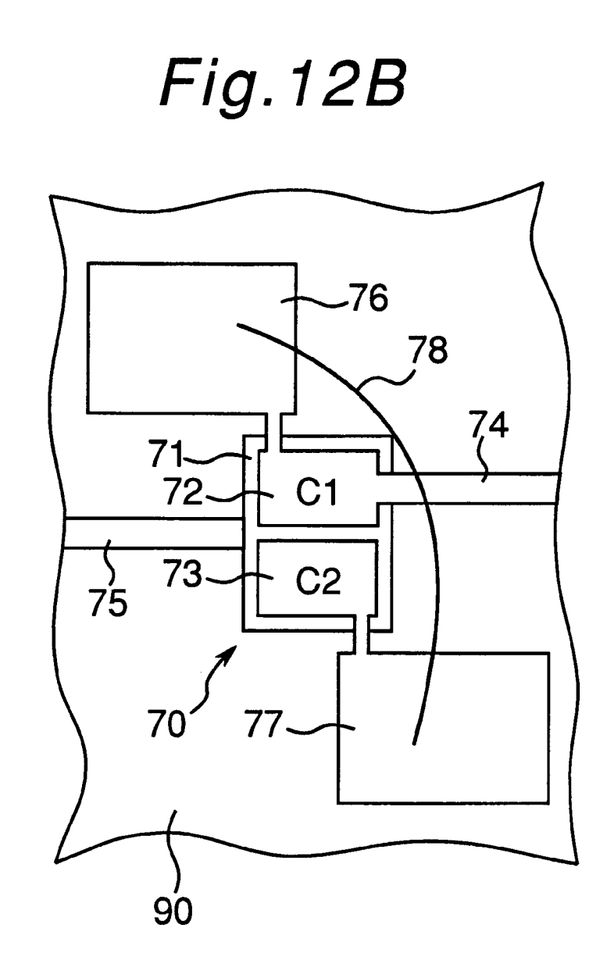

In the MIM capacitor 70 constituted as described above, the value of capacitance can be increased by connecting the electrode pad 76 and the electrode pad 77 with a conductive wire, for example, as shown in FIG. 12B. In this variation, capacitance can be set to greater number of different values by dividing the upper electrode into three or more parts.

Although the variable capacitive element 1 and the short stub 2 are used in the input matching circuit in the first through the sixth embodiments, the present invention is not limited to this configuration and these elements may also be used as an output matching circuit. In this case, the output matching circuit is constituted from the variable capacitive element of which one end is connected to one terminal of the transistor 21 that is used as an output terminal, and the short stub 2 of which one end is connected to the other end of the variable capacitor and the other end is directly grounded. Such a configuration as described above operates similarly to the first embodiment and has similar effects.

As described above, because the high frequency amplifier circuit of the present invention has the matching circuit provided with the variable capacitive element of which one end is connected to a terminal of the transistor and the other end is connected to the external connection terminal, and the short stub of which one end is connected to the other end of the variable capacitor and the other end is directly grounded, various frequencies can easily be accommodated simply by changing the capacitance of the variable capacitive element, and variations in the characteristics can be adjusted by means of the capacitance of the variable capacitive element. This makes it possible to provide a high frequency amplifier circuit which allows easy development into models of different operating frequencies or other properties and high yield of production.

In the high frequency amplifier circuit of the present invention, because various frequencies can be accommodated while being subject to relatively less influence of the bias circuit by connecting the matching circuit to the transistor as an input matching circuit, it is made easier to develop different models.

In the high frequency amplifier circuit of the present invention, because the capacitance of the variable capacitive element can be electrically adjusted by using a field effect transistor or a diode as the variable capacitive element, frequency can be adjusted during use by electrically controlling the capacitance.

In the high frequency amplifier circuit of the present invention, by installing a capacitive element in parallel with the variable capacitive element in the matching circuit, it is made possible to constitute only the portion of capacitance which requires adjustment with the variable capacitive element.

In the high frequency amplifier circuit of the present invention, by further installing a resistive element between the other end of the variable capacitive element and one end of the short stub in the matching circuit, it is made possible to provide a high frequency amplifier circuit which allows gain adjustment.

The first microwave integrated circuit of the present invention has the matching circuit which includes the MIM capacitor of which dielectric layer is interposed between the upper electrode and the lower electrode with either the upper electrode or the lower electrode being connected to the first terminal electrode of the transistor and the short stub comprising the strip electrode of which one end is connected to the other electrode of the MIM capacitor and the other end is directly grounded, while the upper electrode is formed by using a mask having an aperture area which corresponds to a value of capacitance required for the operating frequency of the high frequency amplifier circuit.

With this configuration, a matching circuit suited for the operating frequency can be made by changing only the mask used when forming the upper electrode, thereby making it possible to provide the microwave integrated circuit capable of developing into various models of different operating frequencies.

In the first microwave integrated circuit described above, capacitance of the MIM capacitor and the short stub parameter can be set to specified values by forming the strip electrode in such a configuration that has a C-shaped portion while the C-shaped portion is appropriately sized to set the length of the strip electrode to a length required for the operating frequency of the high frequency amplifier circuit. Because a matching circuit more suitable for the operating frequency can be made with this configuration, a microwave integrated circuit which allows easy development into different models can be provided.

The second microwave integrated circuit according to the present invention has the matching circuit which includes the MIM capacitor of which dielectric layer is interposed between the upper electrode and the lower electrode with either the upper electrode or the lower electrode being connected to the first terminal electrode of the transistor, and the short stub comprising the strip electrode of which one end is connected to the other electrode of the MIM capacitor and the other end is directly grounded, while the upper electrode comprises a plurality of separated electrodes and at least one of the plurality of separated electrodes is used to set the capacitance of the MIM capacitor to a value required for the operating frequency of the high frequency amplifier circuit.

Because a matching circuit suited for the operating frequency can be made with this configuration, a microwave integrated circuit which allows easy development into different models can be provided.

In the second microwave integrated circuit described above, capacitance of the MIM capacitor and the short stub parameter are set to specified values by forming the strip electrode in such a configuration that has a C-shaped portion while the C-shaped portion is appropriately sized to set the length of the strip electrode to a length required for the operating frequency of the high frequency amplifier circuit. Because a matching circuit more suitable for the operating frequency can be made with this configuration, a microwave integrated circuit which allows easy development into different models can be provided.

In the second microwave integrated circuit described above, a microwave integrated circuit which allows the adjustment of frequency in the assembly process can be provided, by connecting between the separated electrodes and the first electrode, or between the strip electrodes or between the separated electrodes by means of air bridge.

What is claimed is:

1. A high frequency amplifier circuit comprising:

a transistor; and a matching circuit connected between a terminal of said transistor and an external connection terminal, wherein said matching circuit includes:

a variable capacitive element having a first terminal connected to the terminal of said transistor and a second terminal connected to the external connection terminal, a short stub having a first end connected to the second terminal of said variable capacitive element and a second end directly connected to ground, and a capacitive element connected in parallel with said variable capacitive element.

2. The high frequency amplifier circuit according to claim 1, wherein said matching circuit is connected to said transistor as an input matching circuit.

3. The high frequency amplifier circuit according to claim 1, wherein said variable capacitance element comprises at least one of a field effect transistor and a diode.

4. A high frequency amplifier circuit comprising:
a transistor; and
a matching circuit connected between a terminal of said transistor and an external connection terminal, wherein said matching circuit includes:
   a variable capacitive element having a first terminal connected to the terminal of said transistor and a second terminal connected to the external connection terminal,
   a short stub having a first end connected to the second terminal of said variable capacitive element and a second end directly connected to ground, and
   a resistive element connected between the second terminal of said variable capacitive element and the first end of said short stub.

5. The high frequency amplifier circuit according to claim 1, comprising a resistive element connected between the second terminal of said variable capacitive element and the first end of said short stub in said matching circuit.

6. The high frequency amplifier circuit according to claim 2 comprising a resistive element connected between the second terminal of said variable capacitive element and the first end of said short stub in said matching circuit.

7. The high frequency amplifier circuit according to claim 3, comprising a resistive element connected between the second terminal of said variable capacitive element and the first end of said short stub in said matching circuit.

8. A microwave integrated circuit comprising:
a high frequency amplifier circuit including:
   a semiconductor substrate
   a transistor having a first terminal, and
   a matching circuit connected to the first terminal of said transistor, said transistor and said matching circuit being located on said semiconductor substrate, wherein said matching circuit includes an MIM capacitor including:
      first and second electrodes, said first electrode being connected to the first terminal of said transistor;
      an insulation layer interposed between said first and second electrodes, and
      a short stub comprising a strip electrode having a first end connected to said second electrode of said MIM capacitor and a second end directly connected to around, wherein said second electrode has a first area and said second electrode has a second area overlapping the first area with said insulation layer therebetween, and smaller than the first area to produce a capacitance required in said high frequency amplifier circuit at an operating frequency and
      said strip electrode has a C-shaped portion including a length required in said high frequency amplifier at the operating frequency.

9. A microwave integrated circuit comprising:
a high frequency amplifier circuit including:
   a transistor having a first terminal, and
   a matching circuit connected to the first terminal of said transistor, said transistor and said matching circuit being formed on a semiconductor substrate wherein said matching circuit includes an MIM capacitor including:
      first and second electrodes, said first electrode being connected to the first terminal of said transistor;
      a dielectric layer interposed between said first and second electrodes, and
      a short stub comprising a strip electrode having a first end connected to said second electrode of said MIM capacitor and a second end directly connected to ground, wherein said first electrode comprises a plurality of electrodes being spaced from each other, wherein a capacitance of said MIM capacitor is set to a value required in said high frequency amplifier circuit for an operating frequency using at least one of said plurality of electrodes.

10. The microwave integrated circuit according to claim 9, wherein said strip electrode includes a C-shaped portion sized to set the length of said strip electrode to a length required for the operating frequency of the high frequency amplifier circuit.

11. The microwave integrated circuit according to claim 9, wherein a connection between at least one of: said plurality of electrodes and the first terminal of said transistor, and said strip electrode and said plurality of electrodes comprises an air bridge.

12. The microwave integrated circuit according to claim 10, wherein a connection between at least one of: said plurality of electrodes and the first terminal of said transistor, and said strip electrode and said plurality of electrodes comprises an air bridge.

13. The microwave integrated circuit of claim 8 wherein said first and second electrodes of said MIM capacitor comprise upper and lower electrodes, respectively.

14. The microwave integrated circuit of claim 9 wherein said first and second electrodes of said MIM capacitor comprise upper and lower electrodes, respectively.

15. The high frequency amplifier circuit according to claim 4 wherein said matching circuit is connected to said transistor as an input matching circuit.

16. The high frequency amplifier circuit according to claim 4 wherein said variable capacitive element comprises at least one of a field effect transistor and a diode.

* * * * *